(12) United States Patent
Bruck et al.

(10) Patent No.: US 9,770,781 B2
(45) Date of Patent: Sep. 26, 2017

(54) MATERIAL PROCESSING THROUGH OPTICALLY TRANSMISSIVE SLAG

(71) Applicants: Gerald J. Bruck, Oviedo, FL (US); Ahmed Kamel, Orlando, FL (US)

(72) Inventors: Gerald J. Bruck, Oviedo, FL (US); Ahmed Kamel, Orlando, FL (US)

(73) Assignee: SIEMENS ENERGY, INC., Orlando, FL (US)

( * ) Notice: Subject to any disclaimer, the term of this patent is extended or adjusted under 35 U.S.C. 154(b) by 162 days.

(21) Appl. No.: 14/144,680

(22) Filed: Dec. 31, 2013

(65) Prior Publication Data

US 2014/0220374 A1    Aug. 7, 2014

Related U.S. Application Data

(60) Provisional application No. 61/758,795, filed on Jan. 31, 2013.

(51) Int. Cl.
*B23K 26/00* (2014.01)
*B23K 26/34* (2014.01)
(Continued)

(52) U.S. Cl.
CPC .............. *B23K 26/009* (2013.01); *B23K 9/18* (2013.01); *B23K 26/122* (2013.01);
(Continued)

(58) Field of Classification Search
CPC .. B23K 9/04; B23K 15/0086; B23K 26/0021; B23K 26/0048; B23K 26/1411;
(Continued)

(56) References Cited

U.S. PATENT DOCUMENTS 4,192,370 A * 3/1980 Rabinovich et al. ......... 164/515
4,540,038 A   9/1985 Burke
(Continued)

FOREIGN PATENT DOCUMENTS

CN    85103662 A    11/1986
CN    102112266 A    6/2011
(Continued)

OTHER PUBLICATIONS

G. J. Bruck, A Study of Fluxing Agents in High Power Laser Beam Cladding, Mar. 7, 1989, Westinghouse R&D Center, Pittsburgh, Pennsylvania.
(Continued)

*Primary Examiner* — Quang D Thanh
*Assistant Examiner* — Brandon Harvey

(57) ABSTRACT

A process for growing a substrate (24) as a melt pool (28) solidifies beneath a molten slag layer (30). An energy beam (36) is used to melt a powder (32) or a hollow feed wire (42) with a powdered alloy core (44) under the slag layer. The slag layer is at least partially transparent (37) to the energy beam, and it may be partially optically absorbent or translucent to the energy beam to absorb enough energy to remain molten. As with a conventional ESW process, the slag layer insulates the molten material and shields it from reaction with air. A composition of the powder may be changed across a solidification axis (A) of the resulting component (60) to provide a functionally graded directionally solidified product.

16 Claims, 2 Drawing Sheets

(51) Int. Cl.
  *C30B 29/52* (2006.01)
  *C30B 11/00* (2006.01)
  *C30B 11/04* (2006.01)
  *B23K 26/18* (2006.01)
  *B23K 26/122* (2014.01)
  *B23K 26/211* (2014.01)
  *B23K 9/18* (2006.01)
  *B23K 26/12* (2014.01)

(52) U.S. Cl.
  CPC .......... *B23K 26/1224* (2015.10); *B23K 26/18* (2013.01); *B23K 26/211* (2015.10); *B23K 26/34* (2013.01); *C30B 11/005* (2013.01); *C30B 11/04* (2013.01); *C30B 29/52* (2013.01); *Y10T 428/12458* (2015.01)

(58) Field of Classification Search
  CPC ............ B23K 26/1429; B23K 35/0244; B23K 35/288; B23K 15/004; B23K 15/0046; C22B 9/223; C22B 9/228; C23C 16/483; H01J 37/305; H01J 2237/3128
  USPC ................ 427/551, 554, 557, 559, 596, 597
  See application file for complete search history.

(56) References Cited

U.S. PATENT DOCUMENTS

| | | | |
|---|---|---|---|
| 5,308,407 A * | 5/1994 | Bishel et al. | 148/26 |
| 7,455,740 B2 * | 11/2008 | Bostanjoglo et al. | 148/525 |
| 7,690,112 B2 | 4/2010 | Bostanjoglo et al. | |
| 2010/0116793 A1 | 5/2010 | Grüger et al. | |
| 2010/0291406 A1 * | 11/2010 | Suzuki et al. | 428/680 |
| 2011/0073636 A1 | 3/2011 | Arjakine et al. | |
| 2011/0076147 A1 * | 3/2011 | Ganesh et al. | 416/204 R |
| 2012/0061354 A1 * | 3/2012 | Posch | B23K 9/24 219/121.14 |
| 2012/0181255 A1 | 7/2012 | Bruck | |
| 2013/0136868 A1 | 5/2013 | Bruck et al. | |
| 2013/0140278 A1 | 6/2013 | Bruck et al. | |
| 2013/0140279 A1 | 6/2013 | Bruck et al. | |
| 2013/0142965 A1 | 6/2013 | Bruck et al. | |

FOREIGN PATENT DOCUMENTS

| | | |
|---|---|---|
| JP | S60121094 A | 6/1985 |
| JP | 60261659 A | 12/1985 |
| JP | 2003220492 A | 8/2003 |
| JP | 2003311392 A | 11/2003 |
| JP | 2010207874 A | 9/2010 |
| JP | 2011530409 W | 12/2011 |
| JP | 2016513200 W | 5/2016 |
| RU | 2212982 C2 | 9/2003 |
| RU | 2321678 C2 | 4/2008 |
| RU | 2447980 C2 | 4/2012 |
| SU | 1516279 A | 10/1989 |
| WO | 9855257 A1 | 12/1998 |
| WO | WO 2012083922 A1 * | 6/2012 |

OTHER PUBLICATIONS

Konrad Wissenbach, Presentation of EC Project FANTASIA, Mar. 31, 2011, Fraunhofer Institute for Laser Technology, Aachen, Germany.

Brij B. Seth, Superalloys—The Utility Gas Turbine Perspective, Siemens Westinghouse Power Corporation, Orlando, Florida, pp. 13-14.

William J. O'Sullivan, Variable-Transparency Wall Regulates Temperatures of Structures, Jun. 1064, NASA Technical Brief 63-10528.

* cited by examiner

MATERIAL PROCESSING THROUGH OPTICALLY TRANSMISSIVE SLAG

This application claims benefit of the 31 Jan. 2013 filing date of U.S. provisional patent application No. 61/758,795.

FIELD OF THE INVENTION

This invention relates generally to the field of materials technologies, and more particularly to an additive process using an energy beam to melt a feed material, and in one embodiment to a process for depositing metal using a laser heat source.

BACKGROUND OF THE INVENTION

Electro slag welding (ESW) is a conventional process. ESW creates a molten alloy pool by continuously passing an electrical current through one or more feed metal wires to a substrate surface through a molten and electrically conductive slag. There is no arc in the process, but electrical resistance in the slag and metal generates heat and continuously melts the feed metal, thereby adding to the molten metal pool. As the depth of the molten pool increases, the metal at the bottom of the pool is cooled and solidifies in a vertical direction, thereby adding freshly cast material to the substrate. This type of process is often used to join very thick plates such as for bridges or oil storage tanks. In those applications, the edges of the plates being joined contain two sides of the molten pool and water cooled copper shoes are used to contain the other two sides.

A disadvantage of electro slag welding is a lack of flexibility in the delivery of filler metal and electrical energy which are generally fixed by the initial hardware setup. This makes it difficult to optimize the heat distribution, to change the filler metal, or otherwise to modify the process once it is underway. As a result, ESW is not a process that is commonly used to repair an existing component.

BRIEF DESCRIPTION OF THE DRAWINGS

The invention is explained in the following description in view of the drawings that show.

DETAILED DESCRIPTION OF THE INVENTION

Figure 1:
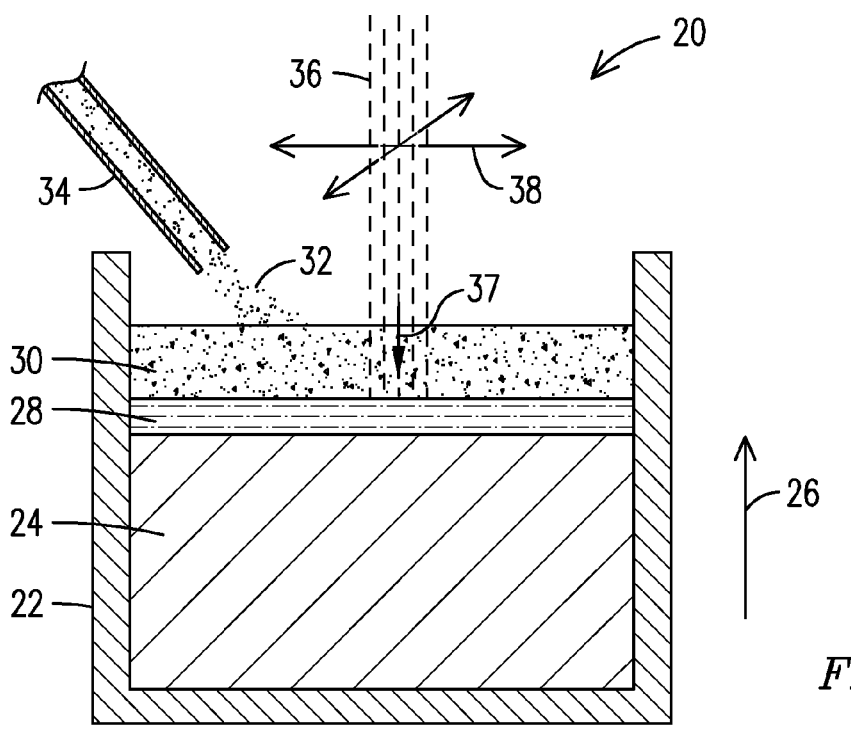
FIG. 1 is a schematic front sectional view of an apparatus operating according to aspects of the invention.

FIG. 1 shows an apparatus 20 operating according to aspects of the invention. The apparatus includes a mold 22, which may for example be a water-cooled copper mold or a refractory metal or ceramic mold with or without cooling and/or heating. An alloy substrate 24 is being deposited and built-up in the mold 22. It may grow uniaxially 26 as a metal alloy melt pool 28 solidifies beneath a molten slag layer 30. An alloy powder 32 may be deposited onto or sprayed into the slag layer 30 by a feed device 34. The alloy powder 32 may be sprayed through the surface tension of the molten slag layer 30, or it may become submerged due to its weight prior to or during melting. A laser beam 36 is directed along one or more paths 38, which may be scanned and rastered as later described, in order to create a desired melt area.

The invention applies an energy beam such as laser energy 36 to the powder 32 to add to the melt pool 28 for a repair, weld, or fabrication. The slag layer 30 that covers the melt pool 28 is at least partially transparent 37 to the laser energy. As with a conventional ESW process, the slag layer 30 insulates the molten metal 28, and shields it from reaction with air. Slag materials may be selected for low reaction with air. Filler metal in the form of alloy powder 32 (feedstock for the melt pool) is fed into the pool, melted by the laser energy and allowed to solidify to add to the alloy substrate 24. The slag may be partially optically absorbent or translucent to the laser energy to absorb enough energy from the laser 36 to remain molten. The slag layer 30 provides thermal insulation for the melt pool 28 and may remain sufficiently heated by the molten metal 28 without being partially absorbent to the laser energy in some embodiments.

Figure 2:
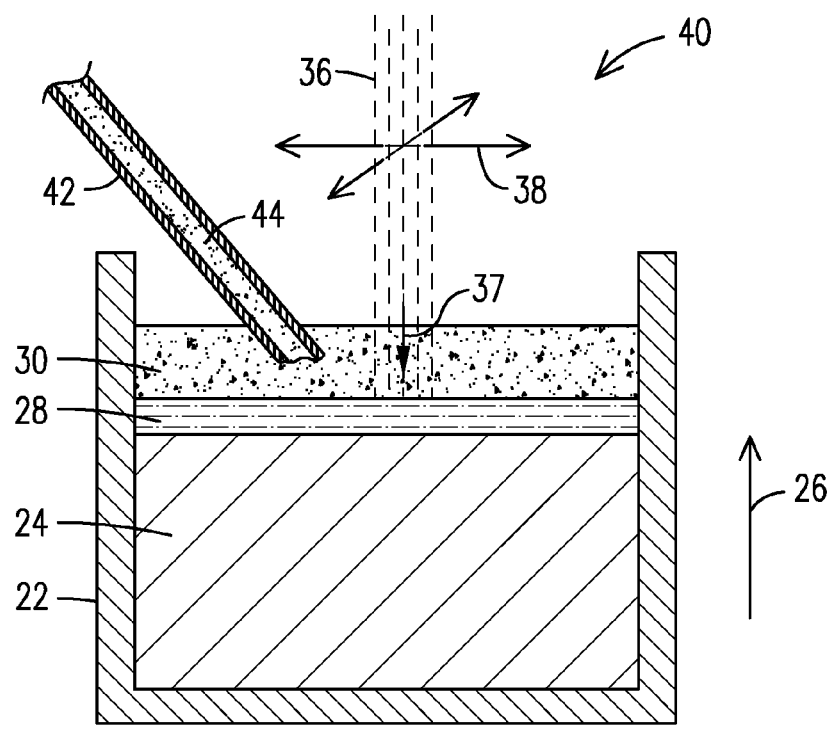
FIG. 2 is a schematic front sectional view of an apparatus operating according to a second embodiment of the invention.

FIG. 2 shows an embodiment 40 in which the feedstock is provided in the form of a wire or strip, such as hollow feed wire 42 with a powdered alloy core 44 that may contain constituents of the desired alloy 24. Some superalloys are difficult to fabricate into wire but are available as powders. A hollow wire 42 can be fabricated from an extrudable subset of a desired superalloy with a core 44 of powder containing the remaining constituents. For example, a NiCoCrAlY superalloy may be difficult to draw or extrude into a wire. However, a nickel wire can be made with a hollow core containing powders of Co, Cr, Al, and Y. These powders may be formed of particles in alloy form and/or as elemental or compound forms. Flux material and/or other slag-enhancing constituents may also be included in the core. Mixing of the constituents in the melt pool may be improved by electromagnetic stirring of the melt and/or by a stirring motion or vibration of the feed wires, or by other means. Such mixing improves uniformity of constituent proportions in the alloy 24, and accelerates separation of slag and released gasses from the melt pool 30.

In another embodiment a combination of feed wires and powdered metal may be utilized as feed material. The composition of a powdered feedstock may be changed during processing by adjusting supplies to the powder feed 34, or by adjusting multiple powder feeds, in order to form a finished metal repair layer or fabrication with graded composition.

Flexible laser optics move the laser beam 36 along a desired heating path 38, and may scan it transversely to the path as it advances along the path, or may scan it to follow defined vectors, and may raster it (turn it on/off at the edges of a shape being painted by successive parallel scans). Laser scanning is a controlled deflection of a laser beam, for example with moving mirrors or prisms or other means. This provides a custom programmable, infinitely shaped optical energy beam, facilitating optimum energy shaping for each portion of each application. It allows changing the shape of the beam exposure area during processing without stopping, which accommodates variations in a surface being repaired or of a joint being welded. Electro slag welding cannot do this with the same flexibility and control, because the shape of the generated heat energy in ESW is mainly determined by the shape and arrangement of the feed wire(s), which are harder and slower to control continuously during processing, or by changing the distribution of electrical resistance in the melt and slag, which are hard to control.

The slag layer 30 is formed by initially depositing a layer of powdered flux material and then heating and melting the flux material to form the molten slag layer 30. Slag/flux materials for embodiments of the invention processing metal alloys may include the following characteristics.

1. Molten at temperatures less than the melting point of the metal alloy (for example less than 1260° C.). This is useful in the case that heat from the underlying molten metal largely keeps the overburden of slag in a molten state.

2. Alternately, molten at temperatures at or modestly above the melting point of the metal alloy. This is useful in the case that, in addition to energy absorbed from the molten metal, additional energy from the laser is absorbed by the slag to maintain it at an elevated temperature.

3. Fully transparent to, or at least partially optically transmissive to the laser wavelength to absorb no laser energy or enough laser energy to remain molten.

4. Shields the molten metal from reaction with air.

5. Is non-reactive with air unless an over-shield of inert gas provides such protection.

Materials that meet these requirements include at least some materials used to make fibers, lenses, and windows for metalworking lasers, as well as phosphate, silicate and ZBLAN glasses. Examples are listed in Table 1 below.

of glasses cited above has superior transmissivity compared to silica and has the potential for laser fiber applications, but only if the material can be manufactured without crystallites. Such manufacture is likely only possible in zero gravity. However, in the liquid state contemplated for this invention, the material will have no crystallites and is expected to be of superior transmissivity. Furthermore, the use of ZBLAN glass is often limited by its fragility, which is not an issue when used in powdered and liquid form as disclosed herein.

Superalloys usable for this application include, but are not limited to, CM 247, Rene 80, Rene 142, Rene N5, Inconel 718, X750, 738, 792, and 939, PWA 1483 and 1484, C263, ECY 768, CMSX-4, and X45. Even superalloys that have traditionally been considered to be non-weldable (i.e. more than 3 wt % aluminum and/or more than 6 wt % titanium) may be deposited successfully according to the present invention. Pre and post weld heat treatments and processing such as Hot Isostatic Pressing (HIP) may be added.

The process disclosed herein may be used to repair conventionally cast, directionally solidified, and single crystal superalloys at a high deposition rate without defects, such that the repair has the properties of the original cast structure. High volume percent gamma prime strengthened nickel based superalloys such as Mar-M-247 (by wt %: Ni-60%, Co-10%, W-10%, Cr-8.3%, Al-5.5%, Ta-3%, Hf-1.5%, Ti-1%, Mo-0.7%, C-0.1%, Zr-0.1%) may be cast over a

TABLE 1

| Material | Formula | Transmissive Wavelength (microns) | Ytterbium Laser | Carbon Dioxide Laser | Melting Temperature (° C.) |
|---|---|---|---|---|---|
| borosilicate glass | N-BK7 | 0 35-2 | X | | 1,200-1,500 |
| phosphate glass (Pb + Fe) | | | X | | 900 |
| phosphate glass (Na + Al) | | | X | | 1,100 |
| silica | $SiO_2$ | 0 185-2 1 | X | | 1,600-1,725 |
| sapphire | $Al_2O_3$ | 0 15-5 | X | | 2,030-2,050 |
| magnesium fluoride | $MgF_2$ | 0 12-6 | X | | 1,263 |
| calcium fluoride | $CaF_2$ | 0 18-8 | X | | 1,418 |
| barium fluoride | $BaF_2$ | 0 2-11 | X | X | 1,368 |
| zinc selenide | ZnSe | 0 6-16 | X | X | 1,525 |
| silicon | Si | 3-5 | | | 1,414 |
| germanium | Ge | 2-16 | | X | 938 |
| ZBLAN glass | $ZrF_4$—$BaF_2$—$LaF_3$—$AlF_3$—NaF | 0 3-7 | X | | various |

Table 1

Transmissive wavelengths in the table are for solid materials. Equivalent data for liquid materials is unavailable—likely because no one contemplates the use of such materials in the liquid state. Some materials have improved light transmission in the liquid state. For example, a helium neon laser beam has relatively weak transmission through solid ice, however, it has high transmission through liquid water. Another example, published by William J. O'Sullivan (NASA Langley), is a variable-transparency wall including a layer of paraffin between sheets of glass. When exposed to intense light, the otherwise opaque or translucent paraffin melts and becomes optically transmissive, thereby allowing the wall to self-regulate its temperature. The ZBLAN family similar material surface to be repaired. The present invention offers a high metal deposition rate while achieving uniaxial cast build-ups that replicate an original manufacture in shape, microstructure and properties. Applications include, but are not limited to, repair of gas turbine blades and vanes. It may also be applied to materials other than superalloys and other than metals.

For applications of the present invention involving repair of an existing component, the containment function of the mold 22 of the figures may be accomplished by a portion of the existing component. For example, if a gas turbine engine blade platform were repaired by grinding out a cracked portion of the platform and then depositing new material with a process as described above, the melt pool 28 and molten slag 30 may be at least partially contained by an unexcavated portion of the existing platform. If the platform had a defect near its edge, for example, that edge of the platform would be removed, and the remaining walls of unexcavated material would partially contain the melt pool and slag, while additional copper, graphite or ceramic shoes would be positioned at the platform edge to contain the melt pool and slag at the newly reformed edges of the platform.

Figure 3:
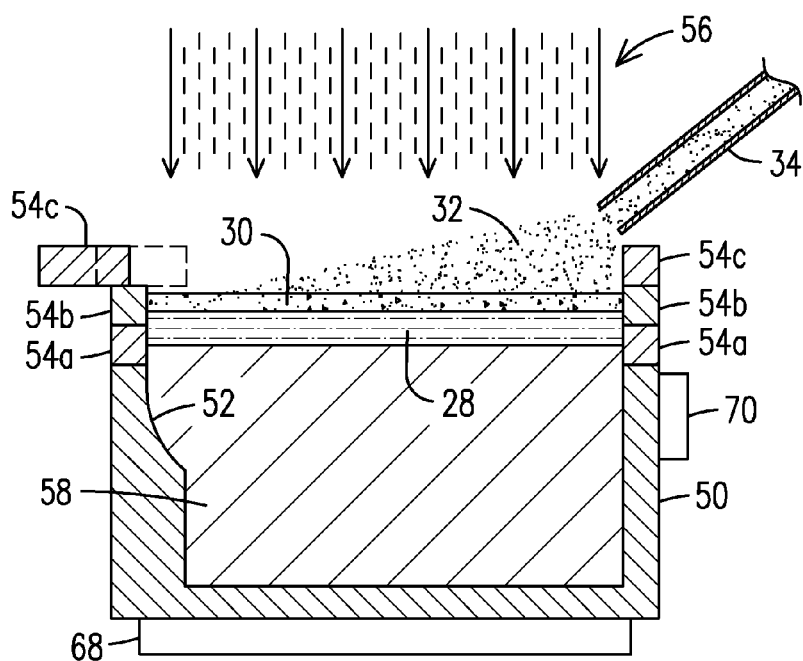
FIG. 3 is a schematic front sectional view of an apparatus operating according to a third embodiment of the invention.

FIG. 3 illustrates another embodiment of the invention useful for the fabrication of a component having a complex geometry. A crucible 50 may have an internal geometry including a curved or non-planar section 52. If the internal geometry is unchanged or gets larger in the vertically upward direction, deposited material will naturally flow into the wider area as the crucible fills. Crucible 50 also includes removable sections or layers 54a, 54b, 54c, which provide for the fabrication of a component shape that gets smaller in the vertically upward direction. Layers 54a, 54b, 54c are each shaped to represent the corresponding section desired in the final product. The energy beam is illustrated as a diode laser beam 56 having a generally rectangular cross-section. The size of the laser beam 56 may be adjusted to correspond to the size of the exposed surface of the molten slag layer 30. As the alloy melt pool 28 solidifies within the crucible 50, the substrate 58 takes the shape of the internal geometry of the crucible 50. Upon solidification of the substrate 58 to the top of a given section 54b, the next higher section 54c is placed into position. Section 54c is illustrated by solid lines in FIG. 3 in its retracted position allowing the deposition of material into section 54b. Section 54c is then moved into a casting position indicated by the dashed lines of FIG. 3 where it protrudes over section 54b for forming a further layer of the substrate 58 having a different shape, thereby defining a step or shelf in the substrate 58.

Figure 4:
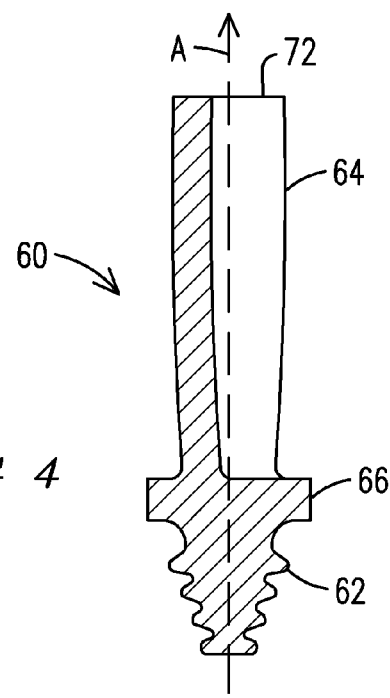
FIG. 4 is a cross-sectional view of a gas turbine engine blade in accordance with aspects of the invention.

One example of a component that may be fabricated in the crucible of FIG. 3 according to the present invention is the gas turbine engine blade 60 of FIG. 4. The blade 60 includes a root section 62 connected to an airfoil section 64 by a platform section 66. As blade 60 is cast in a crucible such as crucible 50, the fixed contours 52 of the crucible 50 may be used to define the shape of the root section 62 and platform section 66, while a moveable section 54c may be used to define the step from the platform section 66 to the airfoil section 64.

Blade 60 may be formed as a directionally solidified or single crystal material by appropriate control of the material deposition process. A heat removal apparatus 68 may be associated with a bottom of the crucible 50 to remove heat and to stimulate the directional solidification of the alloy melt pool 28 in the vertically upward direction. One or more temperature control apparatuses 70 may be associated with a side of the crucible 50 to thermally insulate, heat and/or cool portions of the crucible 50 during the growth of the substrate 58. For example, apparatus 70 may simply insulate the wall of the crucible 50 to allow all heat removal to occur at the bottom of the crucible 50; or it may provide heat to assist in the melting of the slag layer 30 during an initial phase, then provide cooling as the surface of the substrate 58 grows to a location proximate the apparatus 70.

By changing the composition of the alloy powder 32 being fed into the crucible 50 over time, a graded material composition may be achieved in the fabricated component. For example, in response to the different stresses and environmental conditions to be experienced by the root section 62 and airfoil section 64 of blade 60 during operation of a gas turbine engine, it is now possible to form blade 60 to have different material compositions in different regions, even though the blade 60 is a directionally solidified or a single crystal material. For example, blade 60 may be a single crystal superalloy material having a root section 62 formed by providing feed powder 32 with a relatively higher percentage of aluminum for strength, and having an airfoil section 64 formed by providing feed powder 32 with a relatively higher percentage of chromium for corrosion protection. Moreover, a tip portion 72 of blade 60 may be formed by including an abrasion resistant material in the feed powder 32. Thus, for the first time it is now possible to fabricate functionally graded directionally solidified (including single crystal) component (including a superalloy component) wherein a chemical composition of the material changing across its solidification axis A.

A change in the feed powder 32 during a material deposition process may involve only a change in the material being deposited (i.e. the metal alloy of blade 60 of FIG. 4), and/or it may involve a change in a flux material included in the feed powder 32 or otherwise provided into the molten slag layer 30. Not all fluxes are optimal for all materials, so the molten slag layer 30 may be augmented with additional materials or it may be replaced with an alternative material by drawing off some of the slag as replacement flux is added.

Figure 5:
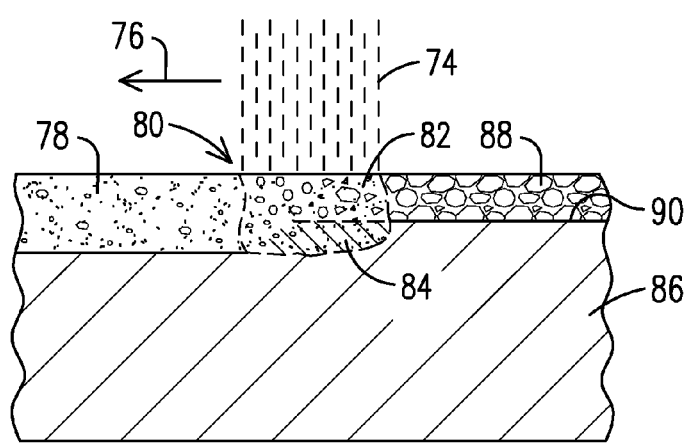
FIG. 5 is a schematic front sectional view of a material deposition process in accordance with aspects of the invention.

Embodiments of the invention are not limited to vertically grown substrates formed in a crucible. FIG. 5 illustrates an embodiment where an energy beam 74 is traversed 76 across the surface of a layer of powder 78 including particles of a metal alloy and particles of a flux material. The flux material may be layered over the alloy material, or the particles may be pre-mixed, or the particles may have a composite structure containing both materials. The energy beam 74 melts the layer of powder 78 to form a melt pool 80 wherein the melted flux material forms a layer of molten slag 82 disposed over a layer of molten alloy material 84 which subsequently solidifies onto the substrate 86. The flux material/slag 82 is selected to be at least partially transmissive to the energy beam 74 in order to allow the energy to melt the alloy particles. The solidified slag 88 forming behind the energy beam 74 can then be removed with any known process to reveal the freshly deposited surface 90 of the expanded substrate 86.

While various embodiments of the present invention have been shown and described herein, it will be obvious that such embodiments are provided by way of example only. Numerous variations, changes and substitutions may be made without departing from the invention herein.

The invention claimed is:

1. A process comprising directing an energy beam through a molten slag layer that is at least partially transmissive to the energy beam in order to melt a feed material for solidification and deposition onto a substrate under the slag layer.

2. The process of claim 1, further comprising:
   depositing the feed material and a flux material as powder onto the substrate;
   traversing the energy beam across the powder to form the molten slag layer and melted feed material; and
   allowing the melted feed material to solidify onto the substrate under the slag layer behind the traversing energy beam.

3. The process of claim 1, wherein the energy beam comprises a laser beam and the slag layer comprises at least one of the group of phosphate glass, borosilicate glass, silica, sapphire, magnesium fluoride, calcium fluoride, barium fluoride, zinc selenide, silicon, germanium and ZBLAN glass.

4. The process of claim 1, further comprising providing the feed material into the molten slag layer as a powder, wire or strip.

5. The process of claim 1, further comprising providing the feed material into the molten slag layer as a cored wire filled with powdered alloy material.

6. The process of claim 1, further comprising directing the feed material and energy beam into a crucible for growing a surface of the substrate within the crucible, the molten slag layer floating above the growing surface of the substrate as molten feed material settles onto the substrate surface and solidifies.

7. The process of claim 6, further comprising:
directing the energy beam into the crucible as a laser beam; and
actively cooling a bottom of the crucible to directionally solidify the substrate vertically.

8. The process of claim 7, further comprising insulating or actively heating a side of the crucible during the step of actively cooling the bottom of the crucible.

9. The process of claim 7, further comprising:
insulating or actively heating a side of the crucible proximate the molten slag layer; and
actively cooling a side of the crucible proximate the surface of the substrate.

10. The process of claim 6, further comprising:
continuously feeding powdered feed material into the crucible while actively cooling a bottom of the crucible to directionally solidify the substrate vertically; and
changing a composition of the powdered feed material over time to form a directionally solidified substrate comprising a graded composition across its thickness.

11. The process of claim 10, further comprising changing a percentage of aluminum in the powdered feed material during the step of continuously feeding.

12. The process of claim 10, further comprising changing a percentage of chromium in the powdered feed material during the step of continuously feeding.

13. The process of claim 1, further comprising:
continuously directing powdered feed material and the energy beam into a crucible;
cooling and solidifying melted feed material via heat transfer through a bottom of the crucible to grow a single crystal substrate material; and
changing a composition of the powdered feed material during the step of continuously directing powdered feed material to produce a graded composition across a thickness of the single crystal substrate material.

14. The process of claim 1, further comprising directing the feed material and energy beam into a crucible comprising a changing cross-sectional shape across its depth for growing a substrate with a corresponding shape within the crucible.

15. The process of claim 14, further comprising forming the crucible of sections selectively assembled as the substrate is grown.

16. The process of claim 1, wherein the energy beam comprises a laser beam and the slag layer comprises at least one of the group of phosphate glass, borosilicate glass, silica, sapphire, magnesium fluoride, barium fluoride, zinc selenide, silicon, germanium and ZBLAN glass.

* * * * *